United States Patent
Kraus et al.

(10) Patent No.: US 8,217,277 B2
(45) Date of Patent: Jul. 10, 2012

(54) MOUNTING PANEL ARRANGEMENT

(75) Inventors: Robert Kraus, Regensburg (DE); Wolfgang Georg Pabst, Deisenhofen (DE); Harald Stoyan, Regensburg (DE)

(73) Assignee: Osram AG, Münich (DE)

( * ) Notice: Subject to any disclaimer, the term of this patent is extended or adjusted under 35 U.S.C. 154(b) by 1056 days.

(21) Appl. No.: 12/070,578

(22) Filed: Feb. 19, 2008

(65) Prior Publication Data

US 2008/0298037 A1   Dec. 4, 2008

(30) Foreign Application Priority Data

Feb. 19, 2007   (DE) .................. 10 2007 008 109

(51) Int. Cl.
*H05K 1/16* (2006.01)
(52) U.S. Cl. ........................................ 174/262
(58) Field of Classification Search ............... 174/262, 174/117 F, 117 FF
See application file for complete search history.

(56) References Cited

U.S. PATENT DOCUMENTS

| | | | | |
|---|---|---|---|---|
| 3,074,043 A * | 1/1963 | Stearns et al. | ................. | 439/77 |
| 3,221,286 A * | 11/1965 | Feede | ............................. | 439/67 |
| 4,655,517 A | 4/1987 | Bryce | | |
| 5,030,137 A * | 7/1991 | Bernhardt | ...................... | 439/492 |
| 5,274,195 A * | 12/1993 | Murphy et al. | ......... | 174/117 FF |
| 5,509,204 A * | 4/1996 | Sadigh-Behzadi | ............. | 29/883 |
| 6,469,261 B2 * | 10/2002 | Yamanashi et al. | ........... | 174/268 |
| 6,927,343 B2 * | 8/2005 | Watanabe et al. | ............. | 174/254 |

FOREIGN PATENT DOCUMENTS

| | | |
|---|---|---|
| DE | 1962067 U | 6/1967 |
| DE | 3227837 | 1/1984 |
| DE | 10050726 | 10/2001 |
| DE | 102004063135 | 7/2006 |
| WO | WO2006/067028 | 6/2006 |

\* cited by examiner

*Primary Examiner* — Chau Nguyen

(74) *Attorney, Agent, or Firm* — Cozen O'Connor

(57) ABSTRACT

A mounting panel arrangement having a plurality of mounting panels for optoelectronic components. Two adjacent mounting panels (1, 2) are connected to one another, in a mechanically stable manner, a connection body (3). Each of the two mounting panels has a connection area (110, 210), each of which is associated with an attachment section (31, 32) of the connection body. For each connection area, a plug connection is formed between the connection area and the associated attachment section.

47 Claims, 8 Drawing Sheets

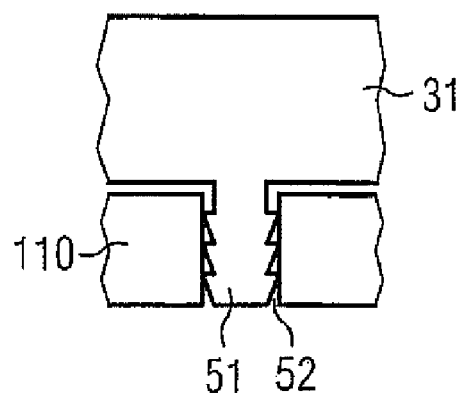
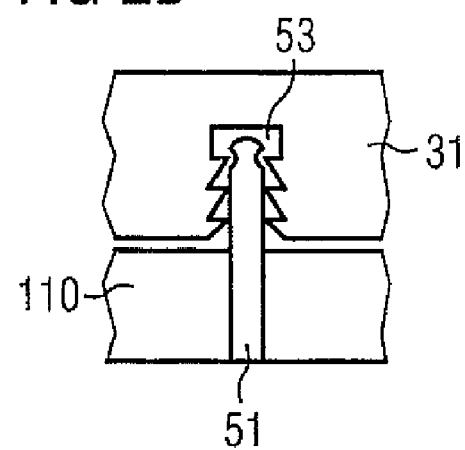
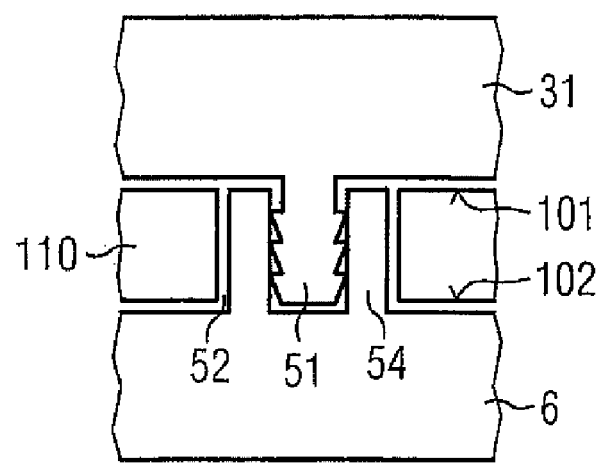

MOUNTING PANEL ARRANGEMENT

RELATED APPLICATION

This patent application claims the priority of German patent application 102007008109.1 filed Feb. 19, 2007, the disclosure content of which is hereby incorporated by reference.

FIELD OF THE INVENTION

The invention relates to a mounting panel arrangement.

SUMMARY OF THE INVENTION

One object of the present invention is to provide a mounting panel arrangement which can be produced particularly easily and at low cost.

This and other objects are attained in accordance with one aspect of the invention directed to a mounting panel arrangement that has a plurality of mounting panels which are intended in particular for optoelectronic components. In the mounting panel arrangement, two mounting panels are adjacent to one another and are connected to one another by means of a connection body, with each of the two mounting panels having a connection area each of which is associated with an attachment section of the connection body, and a plug connection being formed between in each case one of the connection areas and the associated attachment section.

In one preferred refinement, the mounting panel arrangement has a plurality of mounting panels which are adjacent in pairs. It is particularly preferable for two adjacent mounting panels in each case to be connected to one another by means of a connection body, with, in each case, each of the two adjacent mounting panels having a connection area each of which is associated with an attachment section of the connection body, and a plug connection being formed between in each case one of the connection areas and the associated attachment section.

The mounting panels may be adjacent to one another in a plurality of directions at an angle and/or at right angles to one another. For example, the mounting panels may be arranged at grid points of an imaginary two-dimensional or three-dimensional grid. The mounting panels are, however, preferably arranged in a row. In other words, the mounting panel arrangement preferably has a chain, in particular a linear chain, of mounting panels.

The mounting panels in the mounting panel arrangement are in one refinement arranged parallel to one another, in particular with their main planes of extent being parallel to one another.

A mechanically stable connection between two adjacent mounting panels by means of a connection body wherein a plug connection is provided between each of the mounting panels and the connection body can therefore be produced particularly easily, quickly and/or at low cost. For example, by means of the connection body the mounting panels can be plugged together by hand, preferably without a tool.

The plug connection is preferably formed directly between at least one of the connection areas and the associated attachment section of the connection body.

In the present context, the expression "a direct plug connection" means that the connection area and the attachment section interact directly with one another and are thus locked to one another. For example, the connection area and the attachment section are directly adjacent to one another. Alternatively or additionally, the attachment section for a direct plug connection engages in and/or clasps the connection area. Alternatively or additionally, the connection area can also engage in and/or clasp the attachment area. However, a direct plug connection between the connection area and the attachment section does not, in particular, include embodiments in which a further component is arranged between the connection area and the attachment section, so that the connection area and the attachment section are separated from one another. For example, a connection in which a (plug) connection is produced between the attachment section of the connection body and a further component, for example, a plug or a socket, and only the further component is attached to the connection area of the mounting panel, for example by means of soldering, adhesive or by a further plug connection, is not a direct plug connection.

A direct plug connection is particularly space-saving. For example, this makes it possible for the mounting panel arrangement to have a low physical height. This is advantageous, for example, when at least one of the mounting panels is a component of an LED module. By way of example, the LED module contains a first of the two adjacent mounting panels and at least one radiation-emitting semiconductor component on the first mounting panel.

A radiation-emitting semiconductor component in the present context has at least one semiconductor layer stack which contains an active zone which is suitable for generating electromagnetic radiation. In particular, the active zone contains an organic and/or inorganic semiconductor material. In other words, the radiation-emitting semiconductor component is an OLED (organic light-emitting diode) or an LED (light-emitting diode). The radiation-emitting semiconductor component also preferably has a housing in which the semiconductor layer stack is arranged and which, for example, is designed for surface mounting.

The mounting panel arrangement preferably has a plurality of LED modules, each of which contain one of the mounting panels and at least one radiation-emitting semiconductor component on the mounting panel.

Owing to the low physical height, there is only a comparatively low risk with the mounting panel arrangement of electromagnetic radiation emitted by the radiation-emitting semiconductor component during operation being shadowed by the connection body.

In one preferred refinement of the mounting panel arrangement, at least one of the connection areas and/or at least one of the attachment sections in each case has at least one attachment element by means of which the plug connection is made.

By way of example, one of the connection areas has a first attachment element, and the attachment section associated with the connection area has a second attachment element. In one preferred development, the second attachment element is in the form of a mating piece to the first attachment element.

In particular in order to form a direct plug connection, the second attachment element preferably engages in the mounting panel, with which the attachment section is associated.

In a further refinement, the mounting panel arrangement has a holding member which is intended to make the plug connection robust between one of the connection areas and the associated attachment section. By way of example, the holding member for this purpose has at least one further attachment element. In particular, the holding member reduces the risk of the plug connection becoming loose. A holding member also makes it possible to fix the connection area to the attachment section particularly rigidly.

The attachment element or at least one of the attachment elements is, for example, in the form of a depression, a cutout, in particular a hole, a projection, a pin or a ring. In one refinement, the further attachment element of the holding member is alternatively or additionally in one of these forms.

By way of example, the first attachment element is a cutout, preferably a hole, and the second attachment element is a pin which, for example, is arranged such that it fits accurately in the hole. The centre axes of the pin and of the hole preferably run at right angles or are inclined with respect to the main plane of extent of the mounting panel. The pin and the hole expediently have a common centre axis.

In one refinement, at least one of the attachment elements has a locking equipment. By way of example, at least a part of the surface of the attachment element is provided with sawtooth-shaped structures in order to form the locking equipment.

In a further refinement, a front side of the first of the two adjacent mounting panels faces, at least in its connection area, the associated attachment section of the connection body. The front side of the mounting panel is preferably the side intended for mounting of electrical and/or electronic components. Particularly in the case of a mounting panel which is a component of an LED module, the light-emitting semiconductor component or the light-emitting semiconductor components is or are preferably arranged on the front side of the mounting panel.

The attachment section which is associated with the second mounting panel may also face the front side of the second mounting panel, at least in its connection area. Alternatively, it may face a rear side, opposite the front side, of the second mounting panel at least in its connection area. In other words, a first attachment section of the connection body is adjoining a first main face of the first mounting panel, or is adjacent to it, and the second attachment section is preferably adjacent to or adjoining either the first or the second main face, opposite the first main face, of the second mounting panel. In one development, the first main faces are arranged at the front sides of the mounting panels. Alternatively, the first main faces can be arranged at the rear sides of the mounting panels.

If the mounting panel arrangement has a holding member, the holding member and the associated attachment section are preferably arranged on mutually opposite sides of that mounting panel whose connection area is associated with the attachment section. In other words, the attachment section is adjacent to or adjoining the first main face and the holding member is adjacent to or adjoining the second main face of the mounting panel.

In a further embodiment, the holding member extends from the first connection area to the second connection area. In one development of this refinement, an additional plug connection is formed between the connection body and the holding member. The additional plug connection is expediently arranged in a central area between the first and the second connection area.

In a further refinement, the connection body and the holding member are designed similarly. The expression "designed similarly" in the present context means that the connection body and the holding member essentially have the same basic shape. In this case, the shape of the attachment elements to the connection body and to the holding member may, however, differ to the extent that the connection body and the holding member are suitable, for example, for forming at least one direct plug connection with one another.

In a further refinement, at least one of the attachment sections is structured into a plurality of mutually separate pieces of which in particular at least one, and preferably more or all of them, each has at least one attachment element. The pieces in one development of this refinement are connected to one another by means of a stabilization element such that they are mechanically robust. The stabilization element is preferably arranged in the central area between the attachment sections.

In another refinement, at least one of the mounting panels has a plurality of connection areas which are suitable for connection to at least one of the attachment sections of the connection body. For example, the first mounting panel has a further second connection area in addition to the first connection area, and/or the second mounting panel has a further first connection area in addition to the second connection. In particular, the mounting panels are shaped identically, and each of the mounting panels has a first and a second connection area.

By way of example, at least one of the mounting panels is in the form of a polygon, for example a triangle, a quadrilateral, or an n-sided polygon where n>4 in a plan view of its main plane of extent, which polygon has a plurality of rim areas, each of which comprises one of the edges of the polygon, with at least two of the rim areas each containing one of the connection areas. By way of example, the mounting panel is in the form of a quadrilateral, preferably a rectangle or square, and has two rim areas, each of which contain one of the connection areas and one of two mutually opposite sides of the quadrilateral.

In a further advantageous refinement, a first of the attachment sections of the connection body is suitable for forming a plug connection with a first of the connection areas, but not for forming a plug connection with the second connection area.

The attachment section, which is suitable for forming a plug connection with the first connection area but not with the second connection area, results in the two mounting panels being oriented in a defined manner with respect to one another, particularly when at least one of the mounting panels has a first and a second connection area.

In a further preferred refinement, the connection body has an electrical connection equipment. The electrical connection equipment has two contact-making elements which are electrically conductively connected to one another by means of an electrical connection line. Each of the attachment sections contains one of the two contact-making elements. Furthermore, each of the connection areas of the two adjacent mounting panels expediently also has an electrical connecting point, and the electrical connecting point of one connection area is in each case electrically conductively connected to the contact-making element of the attachment section associated with it.

The connection body preferably has a plurality of electrical connection equipments, i.e. a plurality of electrical connection lines each electrically conductively connecting two contact-making elements. For example, this makes it possible to connect a plurality of mounting panels in the mounting panel arrangement electrically in series and/or in parallel.

In one refinement, at least one of the attachment elements represents one of the contact-making elements or one of the electrical connecting points. For example, at least one of the contact-making elements is a contact pin, for example a metal pin, and/or at least one of the electrical connecting points is a contact hole, for example a metallized hole.

In a further embodiment, the geometric arrangement of the electrical connecting points in a first of the connection areas differs from the geometric arrangement of the electrical connecting points in the second connection area. The geometric arrangement of the contact-making elements in a first of the attachment sections expediently then also differs from the geometric arrangement of the contact-making elements in the second attachment section, so that the first attachment section is suitable for producing a plug connection with the first connection area, and the second attachment section is suitable for producing a plug connection with the second connection area.

By way of example, in the case of refinements in which at least one mounting panel has a plurality of connection areas with electrical connecting points, this reduces the risk during production of the plug connection of electrical connecting points of the first and of the second connection area being interchanged, that is to say in particular the risk of polarity reversal of the electrical connecting points.

In a further advantageous refinement, at least one of the mounting panels—in particular in order to reduce the risk of polarity reversal—has a plurality of connection areas which each contain at least one first and one second electrical connecting point, with the first and second electrical connecting points being arranged such that the first and second electrical connecting points of one connection area and, additionally, first and second electrical connecting points of the various connection areas follow one another alternately when viewed in the clockwise direction or anticlockwise direction. The first and the second electrical connecting points are, in particular, functionally different. For example, the first connecting points have a first function of the following functions and the second connecting points have a second function of the following functions: connection to the positive pole of an electrical power supply device, connection to the negative pole of an electrical power supply device, connection to a common ground, formation of a signal line, for example for connection to a control apparatus, series connection of a radiation-emitting semiconductor component on the first mounting panel to a radiation-emitting semiconductor component on the second mounting panel.

Alternatively or additionally, the connection areas are each arranged in a rim area of the mounting panel, and each have an electrical connecting point which is at a first distance from the edge of the rim area in which the respective connection area is arranged, and a further connecting point which is at a second distance from the edge of the rim area in which the respective connection area is arranged, wherein all the first distances have the same value, all the second distances have the same value, but the first distances and second distances are different from one another. In this case, the electrical connecting points at the first distance are expediently functionally different from the electrical connecting points at the second distance, as stated above, by way of example, for the first and second electrical connecting points.

The mounting panel having first and second connecting points following one another alternately and/or having electrical connecting points at first and second distances, with the first distances being the same as one another, the second distances being the same as one another, and the first and second distances differing from one another, as described above, is always electrically connected with the same polarity to the attachment section of the connection body associated with it irrespective of rotation about a rotation axis which, for example, is parallel to the normal to its main plane of extent. This considerably reduces the risk of electrical polarity reversal.

In a further refinement, the connection body has a first and a second contact-making equipment, with each attachment section containing a first contact-making element which is associated with the first contact-making equipment, and a second contact-making element which is associated with the second contact-making equipment. In a plan view of a plane which passes through all four contact-making elements, first and second contact-making elements preferably follow one another alternately when viewed in the clockwise direction or anticlockwise direction. In particular, the connection lines of the two contact-making equipments cross.

Analogously to the mounting panel, the connection body may alternatively or additionally have at least two contact-making equipments, with each attachment section having a contact-making element of one of the contact-making equipments, which is at a first distance from a side surface of the attachment section which faces away from the other attachment section. Furthermore, each attachment section has a further contact-making element of the other contact-making equipment, which is at a second distance from the side surface of the attachment section facing away from the other attachment section. Expediently, the first distances are the same as one another, the second distances are the same as one another, and the first and second distances differ from one another.

In this way, in particular, each of the two attachment sections is suitable both for connection to the first connection area and for connection to the second connection area. The electrical connection is in this case advantageously produced with the correct polarity to each of the connection areas.

At least one mounting panel in one refinement has at least one of the following elements: circuit board, printed circuit board, metal core circuit board, flexible circuit board, ceramic mount.

In a further refinement, the connection body has a centerpiece which is designed to be deformable, for example flexible and/or sprung. The two adjacent mounting panels are connected to one another in this way by means of the connection body, such that they can move with respect to each other. Alternatively, the centerpiece may also be rigid. In one refinement, the centerpiece is U-shaped.

In one refinement of a mounting panel arrangement with a connection body which has a deformable centerpiece, the centerpiece is plastically deformable. For example, the mounting panel arrangement with a centerpiece such as this is dimensionally stable, although it is not rigid but can be deformed by a user applying force. In particular, the distance and/or the angle between two adjacent mounting panels can be adjusted after the assembly of the mounting panel arrangement is completed.

In one preferred refinement, the centerpiece has at least one of the following elements: wire, cable, ribbon cable, flexible circuit board, metal link, flexible tube. By way of example, a flexible tube, for instance a flexible metal or plastic tube, is suitable for a plastically deformable centerpiece. In particular, the flexible tube is in the form of a so-called "swan neck" or "gooseneck" and, in particular, has a twisted metal and/or plastic band by means of which the dimensional stability and plastic deformability are achieved.

BRIEF DESCRIPTION OF THE DRAWINGS

FIGS. 2A to 3, show schematic cross sections through exemplary embodiments of plug connections.

DETAILED DESCRIPTION OF THE DRAWINGS

Similar or similarly acting components are each provided with the same reference symbols in the exemplary embodiments and figures. The illustrated elements and their size ratios with respect to one another should in principle not be regarded as being to scale, and in fact individual elements may be illustrated excessively large in order to improve the illustration and/or for better understanding.

Figure 1A:
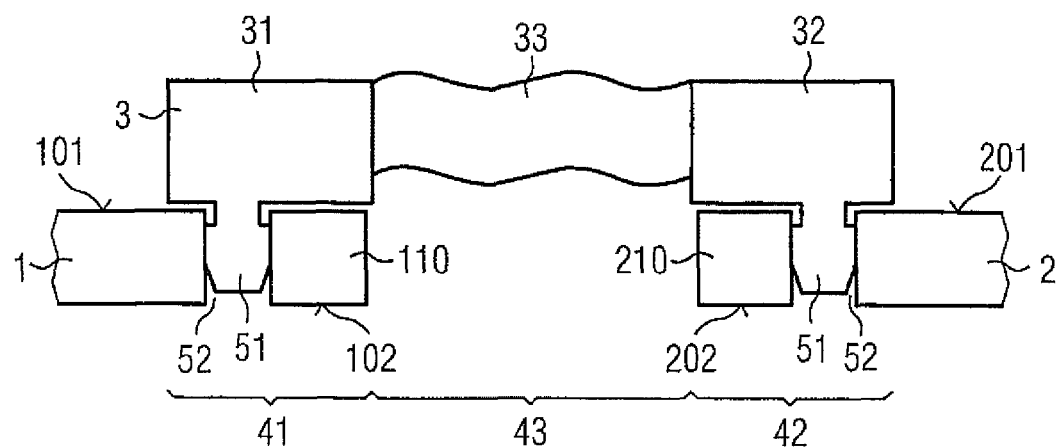
FIG. 1A shows a schematic cross section through a mounting panel arrangement according to a first exemplary embodiment.
Figure 1B:
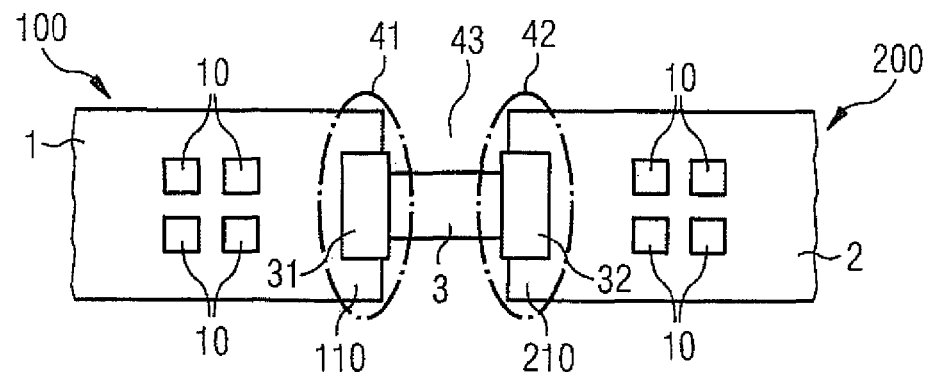
FIG. 1B shows a schematic plan view of a mounting panel arrangement according to the first exemplary embodiment.

A mounting panel arrangement according to a first exemplary embodiment is illustrated in the form of a schematic plan view in FIG. 1B. FIG. 1A shows a detail of the mounting panel arrangement, enlarged, in the form of a schematic cross section.

The mounting panel arrangement according to the first exemplary embodiment has a first circuit board 1 and a second circuit board 2 which, in the present case, are arranged with their main planes of extent parallel to one another. The mounting panels 1, 2 are, for example, rectangular when seen in a plan view of their main plane of extent. They are arranged such that one edge of the first circuit board and one edge of the second circuit board face one another and, in particular, are parallel to one another. In other words, a first rim area 41 of the first mounting panel 1 and a second rim area 42 of the second mounting panel 2, which each contain one edge of the mounting panel 1 or 2, respectively, face one another. The adjacent mounting panels 1, 2 are separated from one another so that a gap 43 remains between the first and the second rim areas 41, 42.

The first mounting panel 1 is a component of a first LED module 100, and the second mounting panel 2 is a component of a second LED module 200. Each LED module 100, 200 in the present case has a plurality of light-emitting semiconductor components 10, which are mounted on the respective mounting panel 1 or 2. The mounting panels 1, 2 are preferably circuit boards which have conductor tracks (not illustrated) by means of which the radiation-emitting semiconductor components 10 are electrically connected.

A connection body 3 extends from the first rim area 41 across the gap 43 to the second rim area 42. The connection body 3 has a first attachment section 31, which is faced by a first main face 101 of the first mounting panel 1. The first main face 101 of the first mounting panel 1 is arranged in the present case at a front side of the mounting panel 1, on which the radiation-emitting semiconductor components 10 are arranged. A first main face 201 of the second mounting panel 2 is arranged in a corresponding manner at a front side of the second mounting panel 2. The first attachment section 31, for example, adjoins to the first main face 101. In particular, the first attachment section 31 is in direct physical contact with the first main face 101.

A first connection area 110 of the first mounting panel 1 is at least partially covered by the first attachment section 31, in a plan view of the first main face 101. In other words, the first connection area 110 of the first mounting panel 1 and the first attachment section 31 of the connection body 3 overlap. The first connection area 110 is arranged in the first rim area 41 in the present case. In alternative embodiments, it may, however, also be expedient for the first connection area 110 not to be arranged in a rim area 41 of the mounting panel 1 but, for example, in a central area of the mounting panel.

A direct plug connection is formed between the first attachment section 31 and the first connection area 110. For this purpose, the connection area 110 has a first attachment element 52, and the attachment section 31 has a second attachment element 51 which, in the present case, is a mating piece to the first attachment element 52. At least one of the connection areas 110, 210 and the respectively associated attachment section 31 or 32 preferably has or have a plurality of such pairs of attachment elements 51/52.

In the present case, the first attachment element is a hole 52 which extends from the first main face 101 of the first mounting panel 1 to the second main face 102, which is opposite the first main face 101. The second attachment element 51, which is integrally formed on a base body of the attachment section 31 or projects out of the base body, is a pin in the present case and is arranged such that it fits accurately in the hole 52 once the mounting panel arrangement has been installed.

The dimensions of the pin 51 and of the hole 52 are preferably chosen such that the pin 51 is locked in the hole 52. For example, an oversize fit may be provided, that is to say such that the pin 51, when seen in a plan view of the first main face 101, has a slightly larger plan area than the hole 52 before insertion into the latter. In particular, when the plug connection is being made, this results in the pin and/or the material bounding the hole 52 in the first connection area 110 being deformed such that a mechanically stable plug connection is formed between the first attachment section and the first connection area 110. A second attachment section 32 is connected in the same way in the second rim area 42 to a second attachment section 210 of the second mounting panel 2.

By way of example, the plug connection is made by means of an interference fit, a hot interference fit, swaging, hot swaging, thermal riveting and/or adhesive bonding.

In the case of an interference fit, the connection area 110, 210 and the associated attached section 31 or 32, respectively, are attached to one another by means of the pressure which the attachment elements 51, 52 exert on one another. This pressure preferably acts essentially along the normal to the engaged surfaces of the attachment elements.

In the case of a hot interference fit, at least one of the attachment elements, for example the pin 51, is heated such that, although it cannot flow—that is to say in particular such that it is dimensionally stable without any additional force being applied, it can nevertheless be shaped plastically. The heated attachment element 51 matches the shape of the second attachment element 52 by the influence of the force. Once the attachment element 51 has cooled down, the respective connection area 110 or 210 and the associated respective attachment section 31 or 32 are attached to one another.

In the case of swaging, the first and/or the second attachment element 51, 52 are/is subjected to mechanically produced deformation, possibly in addition to pressure to form an interference fit. For this purpose, the attachment element 51, 52 is for example deformed by a deformation tool, for instance a needle, such that the connection area 110 or 210 is attached in a mechanically stable manner to the respective attachment section 31 or 32. In particular, this may involve deformation at one or more points or over an area. In the case of hot swaging, the deformation tool is additionally heated, such that the attachment element 51, 52 has a contact area with the tool where it can be shaped plastically and/or where it can flow. The applied force may be less for hot swaging than for swaging.

In the case of adhesive bonding, the attachment is formed by means of an adhesively bonded joint, which is formed between the attachment elements 51, 52, for example by means of an adhesion promotion material.

In the case of thermal riveting, the first attachment element 51 is heated, preferably in a subarea, such that it can flow and flows onto the second attachment element 52, and cures while cooling down, thus forming a mechanically stable attachment.

The gap 43 between the mounting panels 1, 2 is bridged by a centerpiece 33 of the connection body 3, which is connected to the attachment sections 31, 32. The centerpiece 33 is, in particular, non-detachable from the attachment sections 31, 32 without destruction. In the present case, the attachment sections 31, 32 are rigid and the centerpiece 33 is deformable, so that the mounting panels 1 and 2 of the mounting panel arrangement can move with respect to one another.

The width of the attachment sections 31, 32 is greater than the width of the centerpiece 33 in a plan view of the main plane of extent of the mounting panel arrangement. The width is in this case the extent in the direction of the edges of the mounting panels 1, 2 surrounded by the rim areas 41, 42. For example, the width of at least one of the attachment sections 31, 32 makes up 30% or more, particularly preferably 50% or more, of the width of the respective mounting panel 1 or 2. This results in the attachment section 31, 32 being connected particularly robustly to the connection area 110, 210 with which it is associated.

In the present case, in the course from the first main face 101 to the second main face 102, the pin 51 first has an outward bulge with an increased cross section, by means of which the pin 51 is fixed robustly in the hole 52. This is then followed by a chamfer on the pin. When making the plug connection, the pin can therefore be inserted into the hole 52 particularly easily, and is centered in a simple manner.

By way of example, the connection body 3 is composed of a molding compound, for example an injection-molding, casting and/or pressing compound. For example, the attachment sections 31, 32 comprise the molding compound. The attachment elements 51 may either be formed integrally with the base body of the attachment section 31, for example by likewise being formed from the molding compound, or the attachment element 51 is manufactured separately. It is then preferably partially surrounded by the molding compound, and projects out of it.

The centerpiece 33 is either formed integrally with the attachment sections 31, 32, or each of the two mutually opposite end areas of the centerpiece 33 is connected to one of the attachment sections 31, 32, for example being surrounded by the molding compound of the respective attachment section 31 or 32.

FIG. 2A shows a further exemplary embodiment of the plug connection, in the form of a schematic cross section. As an alternative to an outward bulge, as in the case of the pin 51 in the first exemplary embodiment of the mounting panel arrangement, the pin 51 in the exemplary embodiment shown in FIG. 2A has a plurality of outward bulges. In the present case, it has structures with a sawtooth-like shape. The sawtooth-like structures, in a similar manner to barbs, on the one hand allow the pin to be inserted easily into the hole 52, while on the other hand reducing the risk of the pin 51 being inadvertently removed from the hole 52.

In a further exemplary embodiment, which is illustrated schematically in FIG. 2B, the first attachment element is a depression 53 instead of a hole 52. The depression in the present case has a plurality of sawtooth-like projections which fix the pin 51. A notch in an end piece of the pin and a corresponding projection of the depression 53 lock the pin in the manner of a catch.

In the exemplary embodiment of the plug connections shown in FIG. 2B, the depression 53—alternatively also a hole 52—is contained as the first attachment element in the first attachment section 31 of the connection body 3, and, as the second attachment element, the pin 51 is formed on the first connection area 110 of the mounting body. While this configuration may be useful for some embodiments, the embodiment illustrated in FIGS. 1A, 1B and 2A, in which the attachment section 31 has the pin and the mounting panel 1 has an opening 52 or depression 53 as a mating piece for the pin, is usually preferred, since the mounting panel arrangement can then be produced particularly easily.

The direct plug connection illustrated in FIG. 3 between the first connection area 110 and the first attachment section 31 makes use of a holding member 6 which has a further attachment element 54 which, starting from the second main face 102 of the first connection area 110, engages in the hole 52, preferably with an accurate fit. The further attachment element 54 has an annular shape.

The pin 51 which is formed on the first attachment section 31 likewise engages in the hole 52 in the connection area 110 of the mounting panel 1, starting from the first main face 101. However, in contrast to the exemplary embodiments shown in FIGS. 1A, 1B and 2A, the pin 51 does not make direct contact with the annular side wall or the side walls of the hole 52, but is inserted into the annular attachment element 54 of the holding member 6, in particular by being pressed into it. This results in the mounting panel 1 being fixed in a mechanically stable manner between the holding member 6 and the first attachment section 31.

The exemplary embodiments of plug connections which are illustrated in FIGS. 2A, 2B and 3 and which are explained with reference to the first attachment section 31 and the first mounting panel 1 are, of course, also suitable for the second attachment section 32 and the second printed circuit board 2.

Figure 4:
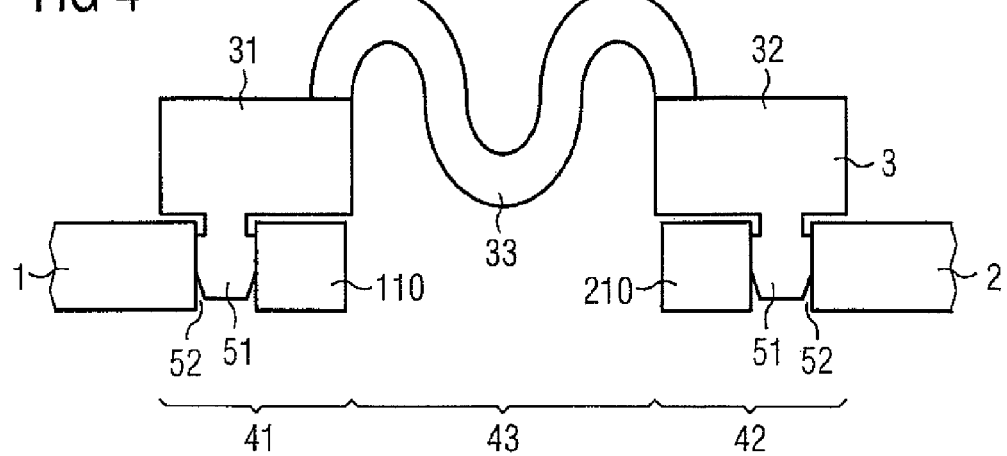
FIG. 4 shows a schematic cross section through a mounting panel arrangement according to a second exemplary embodiment.

In the second exemplary embodiment of a mounting panel arrangement, which is illustrated in the form of a schematic cross section in FIG. 4, the centerpiece 33 of the connection body 3 is U-shaped in the gap 43 between the printed circuit boards 1 and 2. By way of example, in this case, the connection piece has a flexible tube, for example a flexible metal or plastic tube which, in particular in the form of a so-called swan neck, is on the one hand dimensionally stable while on the other hand it is plastically deformable.

Figure 5:
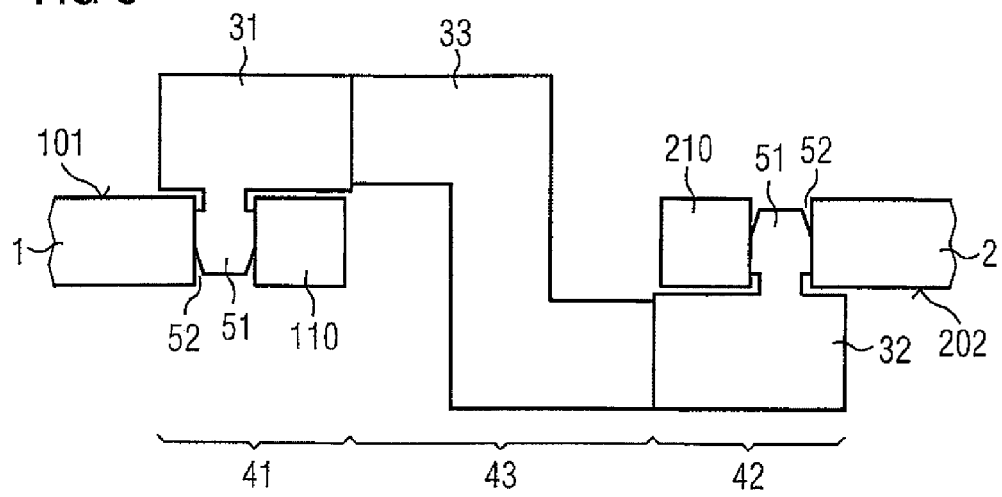
FIG. 5 shows a schematic cross section through a mounting panel arrangement according to a third exemplary embodiment.

The exemplary embodiment illustrated in the form of a schematic cross section in FIG. 5 differs from the previous exemplary embodiments in that the connection body 3 is adjacent to the first main face 101 of the first printed circuit board 1 in the first connection area 110, that is to say in particular adjacent to its front side, on which the radiation-emitting semiconductor components 10 are fitted. In the second connection area 210, the connection body 3 is adjacent to the second main face 202 of the second mounting panel, that is to say facing its rear side.

Since the first main face 101 of the first mounting panel 1 and the first main face 201 of the second mounting panel 2, on which the radiation-emitting semiconductor components 10 are mounted, point in the same direction in the third exemplary embodiment (as in the case of the previous exemplary embodiments as well), the centerpiece 33 runs in the gap 43 between the first mounting panel 1 and the second mounting panel 2 through the common main extent plane of the mounting panels 1, 2 from the first main face 101 to the second main face 202. By way of example, the centerpiece firstly runs parallel to the main plane of extent in the direction from the first mounting panel 1 to the second mounting panel 2, then has a kink or bend, and runs at right angles to the main plane of extent, before once again running parallel to the main plane of extent.

Figure 6:
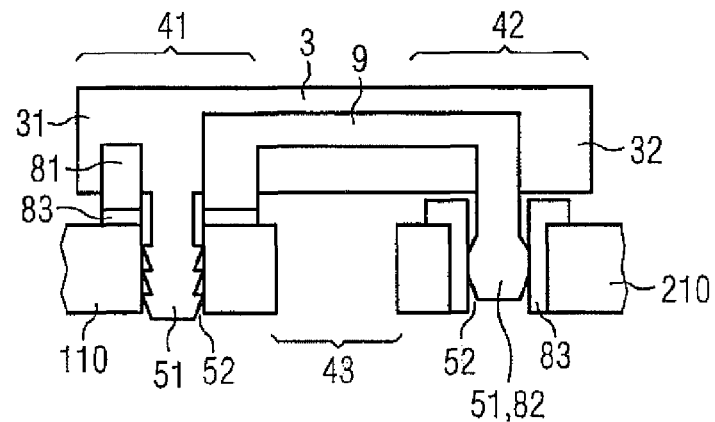
FIG. 6 shows a schematic cross section through a mounting panel arrangement according to a fourth exemplary embodiment.

A fourth exemplary embodiment of the mounting panel arrangement is illustrated in the form of a schematic cross section in FIG. 6. In this exemplary embodiment, the connection body 3 has an electrical connection equipment. This comprises a first contact-making element 81 in the first attachment section 31, and a second contact-making element 82 in the second attachment section 32.

The first contact-making element 81 is illustrated in FIG. 6, by way of example, as an element formed separately from the attachment element 51 of the first attachment section 31. In the present case, the first attachment element 51 is a pin, which is formed together with the first attachment section 31 from an electrically insulating molding compound. The first contact-making element 81 is a metal ring of which the center axis coincides, for example, with the center axis of the pin 51. The metal ring 81 is partially surrounded by the molding compound of the attachment section 31 and projects out of the attachment section 31 on its side facing the first mounting panel 1.

The mounting panel 1 is in the form of a circuit board, for example a printed circuit board (PCB), and, on its first main face 101, has an electrical conductor track 83 which, in a plan view of the first main face 101, surrounds the hole 52, which forms a mating piece to the pin 51, such that the piece of the conductor track which surrounds the hole 52 represents an electrical connecting point 83 of the first connection area 110.

Once the mounting panel arrangement has been plugged together, the conductor track 83 in the first connection area 110 of the mounting panel 1 makes mechanical and electrical contact with the first contact-making element, the metal ring 81.

The right-hand part of FIG. 6 shows an alternative embodiment of the plug connection. In this embodiment, the attachment element 51 of the second attachment section 32 is also a contact-making element 82 for the electrical connection equipment.

By way of example, the contact-making and attachment element 82/51 is a metal pin. The metal pin 82 is inserted in the hole 52, of which the side faces or, in particular, in the case of a hole with a circular or elliptical cross section, the annular side face is electrically conductive at least in a subarea, that is to say it represents an electrical connecting point 83.

The electrically conductive (sub) area of the side face or of the side faces of the hole 52 is expediently electrically conductively connected to a conductor track on the first main face 201 of the second connection area 210. By way of example, the side wall of the hole 52 is covered by a metal layer 83 which, in particular, is produced wet-chemically and/or is formed integrally with the conductor track on the first main face 201 of the mounting panel 2. Methods for metallization of holes 52 and for producing conductor tracks are known in principle to those skilled in the art, and will therefore not be explained any further at this point.

In one advantageous development, the contact pin 82 has a sharp-edged projection (not illustrated) which preferably runs in the longitudinal direction of the contact pin 82, that is to say in particular along its center axis, and cuts into the metal layer in the contact hole 52. This results in a particularly good electrical contact being made, while at the same time mechanically fixing the contact pin 82 in the contact hole 52 in a particularly robust manner.

The first contact-making element 81 and the second contact-making element 82 are connected by means of an electrical connection line 9. In the present case, the electrical connection line 9 is a rigid metal link.

While the electrical contact-making elements 81, 82 differ from one another for exemplary purposes in the illustration in FIG. 6, the electrical contact-making elements 81, 82 of the electrical connection equipment are preferably identical, and are particularly preferably in the form of contact pins 82. An electrical connection equipment for example as in the case of the fourth exemplary embodiment may also be provided for the previous exemplary embodiments of the mounting panel arrangement.

Figure 7:
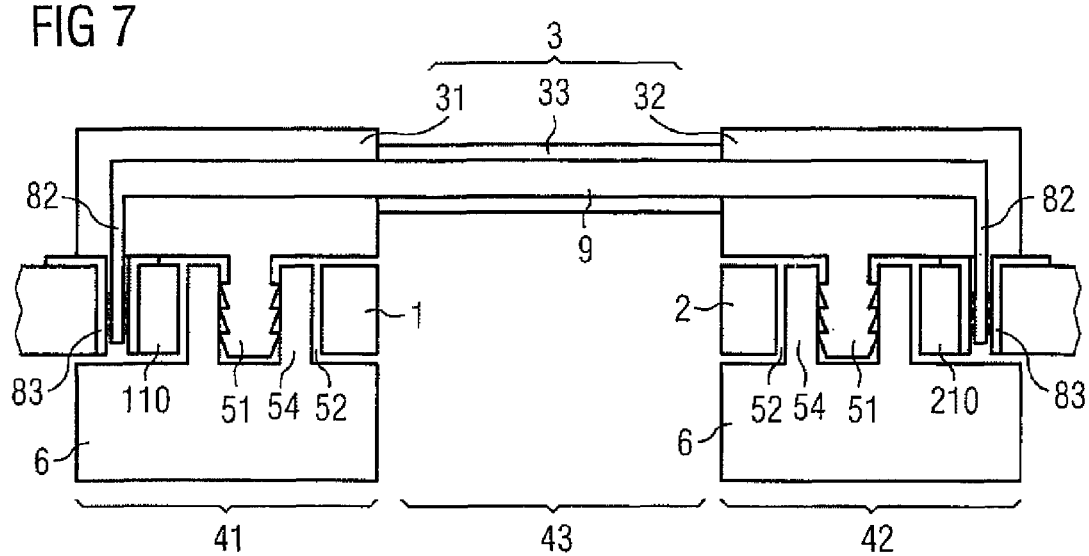
FIG. 7 shows a schematic cross section through a mounting panel arrangement according to a fifth exemplary embodiment.

FIG. 7 shows a schematic cross section through a fifth exemplary embodiment of a mounting panel arrangement. In this exemplary embodiment, the contact pins 82 of the first and of the second attachment section 31, 32 are, in contrast to the fourth exemplary embodiment, formed separately from the attachment elements 51 of the attachment sections 31, 32. Furthermore, the plug connection by means of the attachment element 51 is provided by means of a holding member 6, as described in conjunction with FIG. 3.

In the present case, the contact pins 82 are once again in the form of end pieces of a metal link 9. Sections of the metal link 9 run within the attachment sections 31, 32. Between the attachment sections 31, 32, the metal link 9 is sheathed in the present exemplary embodiment by an electrically insulating material, for example a PVC sheath. By way of example, the centerpiece 33 is formed by the sheathed part of the metal link 9—or by a plurality of metal links 9 if the connection body has a plurality of electrical connection equipments.

Figure 8:
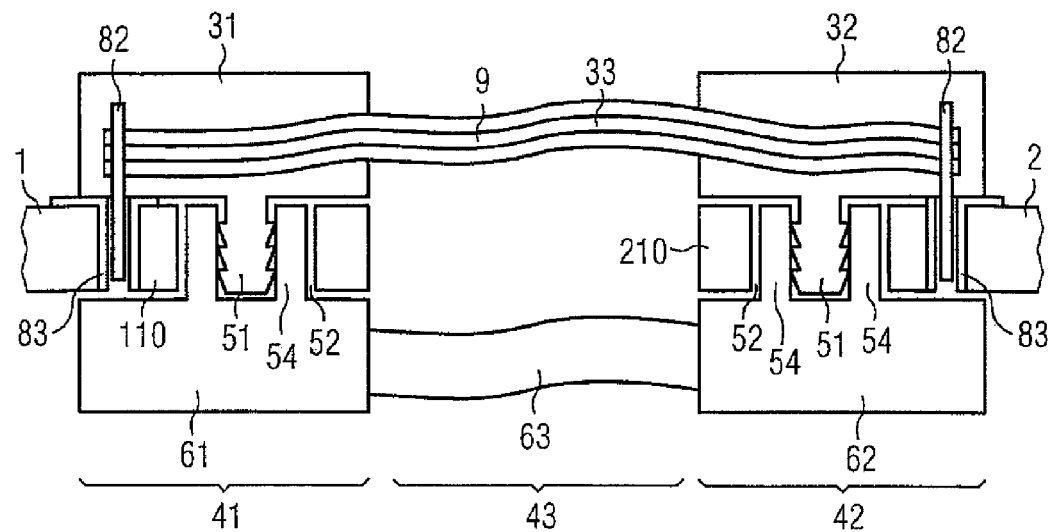
FIG. 8 shows a schematic cross section through a mounting panel arrangement according to a sixth exemplary embodiment.

FIG. 8 shows a schematic cross section of a sixth exemplary embodiment. Each attachment section 31, 32 in the sixth exemplary embodiment has a plurality of contact pins 82 which are electrically conductively and mechanically connected to, for example, in each case one core 9 of a ribbon cable, for example by means of a soldered, crimped or pinched joint.

The connection body 3 in the sixth exemplary embodiment therefore has a plurality of electrical connection equipments, which each comprise a contact pin 82 of the first attachment section 31, a core 9 of the ribbon cable and a contact pin 82 of the second attachment section 32. The contact pins of the attachment sections 31, 32 in the present case are each adjacent to one another in a direction which runs parallel to the edge of the respective mounting panel 1 or 2 which is surrounded by the respective rim area 41 or 42. In other words, the contact pins 82 are therefore, for example, arranged in one or more rows, in particular in rows parallel to an edge of the respective mounting panel 1 or 2.

In the present case, the holding member 6 has a first end piece 61 which stabilizes the plug connection between the first attachment section 31 and the first rim area 110 of the first printed circuit board 1. It also has a second end piece 62, which stabilizes the plug connection between the second attachment section 32 and the second connection area 210. Furthermore, it has a flexible centerpiece 63 which connects the two end pieces 61, 62 to one another. The holding member therefore extends from the first connection area 110 across the gap 43 between the mounting panels 1 and 2 to the second connection area 210.

Figure 9:
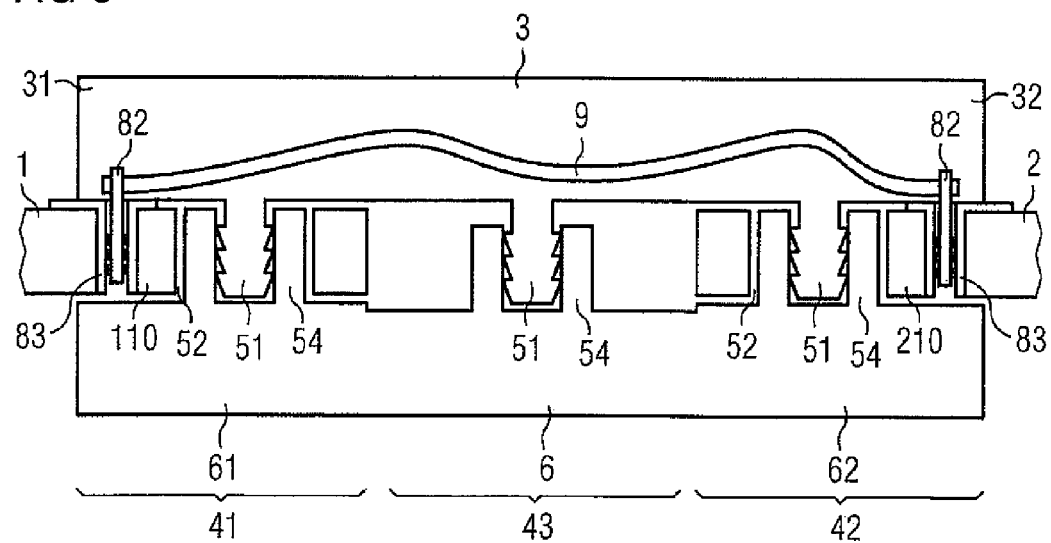
FIG. 9 shows a schematic cross section through a mounting panel arrangement according to a seventh exemplary embodiment.

FIG. 9 shows, schematically, a seventh exemplary embodiment, in which the connection body 3 is a rigid body. The two contact pins of an electrical connection equipment are connected to one another, for example by means of a wire or cable 9. In the present case, the wire or the cable 9 is completely surrounded by a molding compound.

Apart from the electrical connection equipment with the contact pins 82 and the wire 9, the holding member 6 and the connection body 3 are designed similarly. For example, they are coincident in a plan view of the joint main plane of extent of the first and of the second mounting panels 1, 2.

Both the connection body 3 and the holding member 6 each have a further attachment element in the gap 43 between the mounting panels 1, 2, in the present case a pin 51 and a ring 54. These further attachment elements 51, 54 form an additional plug connection between the holding member 6 and the connection body 3, in the gap 43 between the mounting panels 1, 2.

Figure 10:
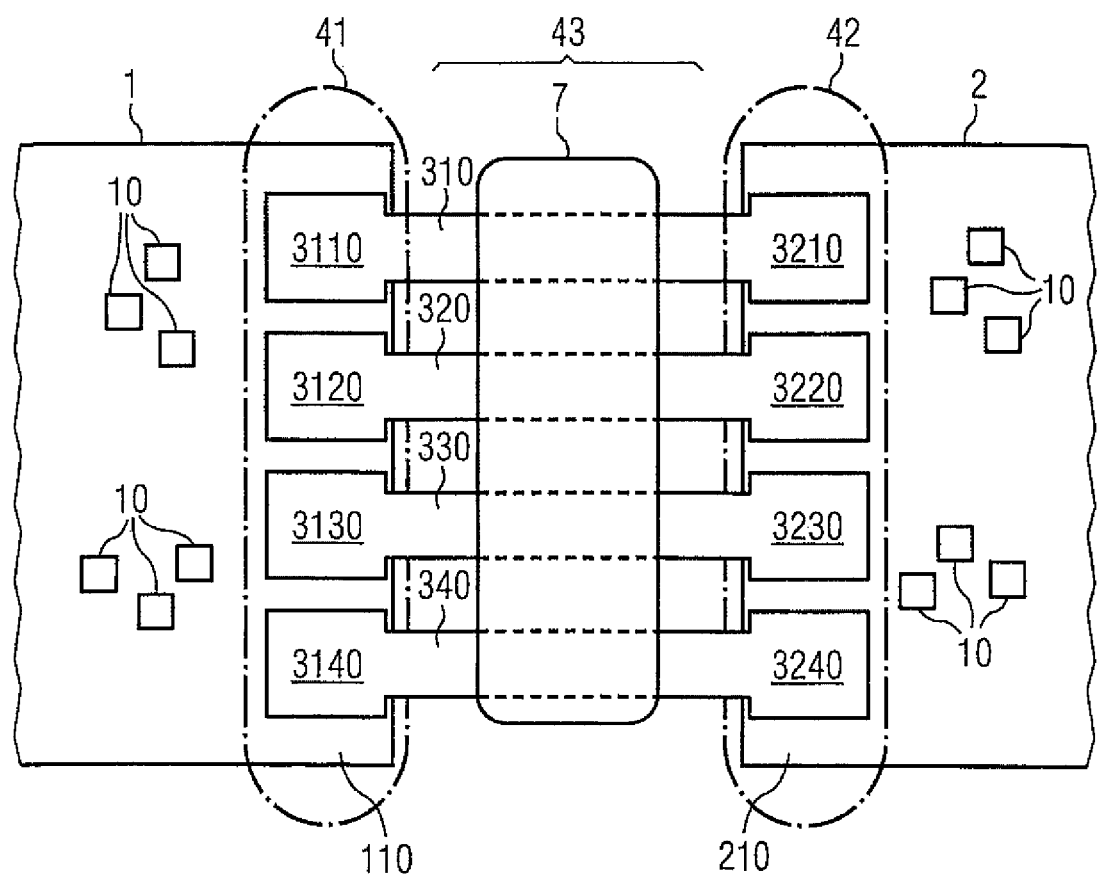
FIG. 10 shows a schematic plan view of a mounting panel arrangement according to an eighth exemplary embodiment.

The eighth exemplary embodiment, shown in FIG. 10, differs from the previous exemplary embodiments in that the attachment sections 31, 32 are not formed over the entire area, for example as illustrated in FIG. 1B, but are structured to form individual pieces 3110, 3120, 3130, 3140 and 3210, 3220, 3230, 3240.

For example, a piece 3110 of the first attachment section 31 together with a piece 3210 of the second attachment section forms a continuous strip 310 which in particular extends from the first rim area 41 across the gap 43 towards the rim area 42. For example, each of the strips 310, 320, 330, 340 has an electrical connection equipment, for example one and only one electrical connection equipment. The strips 310, 320, 330, 340, in particular including the individual pieces 3110, 3120, 3130, 3140 and 3210, 3220, 3230, 3240, respectively are connected to one another in a mechanically stable manner by means of a stabilization element 7.

Figure 11A:
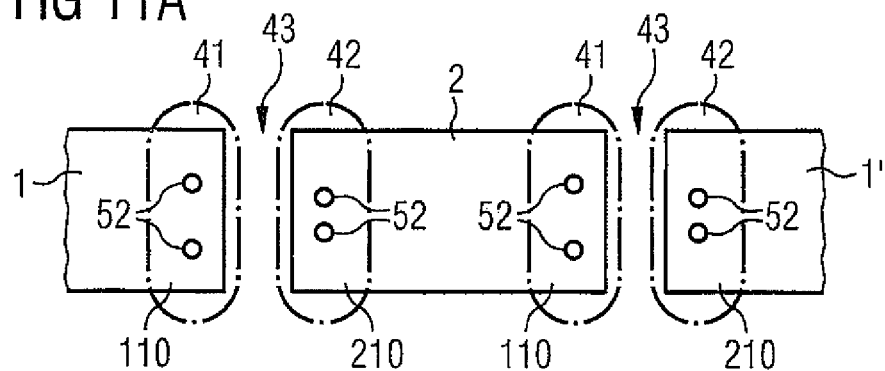
FIGS. 11A and 11B show schematic plan views of the mutually facing sides of mounting panels and connection bodies of a mounting panel arrangement according to a ninth exemplary embodiment.
Figure 11B:
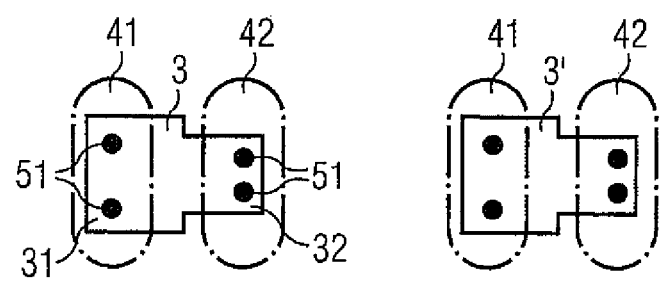

FIGS. 11A and 11B show a detail of a mounting panel arrangement according to a ninth exemplary embodiment. The mounting panel arrangement has a plurality of identical mounting panels 1, 2, 1', which are arranged in a row (see FIG. 11A). Each mounting panel 1, 2, 1' has a first connection area 110 and a second connection area 210. The first and the second connection area 110, 210 are arranged in mutually opposite rim areas 41 and 42 of the mounting panel 1, 2, 1' in a plan view of the main plane of extent of the mounting panel 1, 2, 1'. Alternatively or additionally, it is also possible, for example, for the connection areas 110, 210 to be arranged on adjacent edges, such that the first mounting panel 1, 1' and the second mounting panel 2 are suitable, for example, for connection at an angle to each other and/or for producing a mounting panel arrangement in which the mounting panels are adjacent to one another in a plurality of mutually perpendicular or inclined directions.

As in the case of the previous exemplary embodiments, a first rim area 41 and a second rim area 42 of adjacent mounting panels 1 and 2, or 2 and 1', face one another and are arranged such that the two mutually facing edges of the mounting panels 1, 2 or 2, 1' are parallel to one another, with a gap 43 remaining between the mounting panels 1, 2 and 2, 1'. Each of the connection areas 110, 210 has two attachment elements 52, in the present case holes. The distance between the attachment elements in the first connection area 110 differs from the distance between the attachment elements 52 in the second connection area 210.

FIG. 11B shows a plan view of the connection bodies 3, which are intended for connection of the mounting panels 1 and 2, as well as 2 and 1', illustrated in FIG. 11A. FIG. 11B is a schematic plan view showing the side of the connection bodies 3 which faces the mounting panels 1, 2, 1' after assembly of the mounting panel arrangement. In a corresponding manner to the mounting panels 1, 2, 1', the connection bodies 3 in each attachment section 31, 32 likewise each have at least two attachment elements 51, which are pins in the present case.

The distance between the pins in the first attachment section 31 differs from the distance between the pins in the second attachment section 32. The distance between the attachment elements 51 in the first attachment section 31 is expediently the same as the distance between the attachment elements 52 in the first connection area 110, and the distance between the attachment elements 51 in the second attachment section 32 is equal to the distance between the attachment elements 52 in the second connection area 210. The first attachment section 31 is therefore suitable for connection to one of the first connection areas 110, and the second attachment section 32 is suitable for connection to one of the second connection areas 210.

In one development, the attachment elements 51, 52 are respectively electrical connecting points 83 and contact-making elements 82. In another development, the connection areas 110 and 210 and the attachment sections 31 and 32 alternatively or in addition to the attachment elements 51, 52 each have at least two electrical connecting points 83 and contact-making elements 82, respectively, whose positions and/or distances differ from one another in one advantageous refinement analogously to the exemplary embodiment described above for the attachment elements 51 and 52.

Figure 12A:
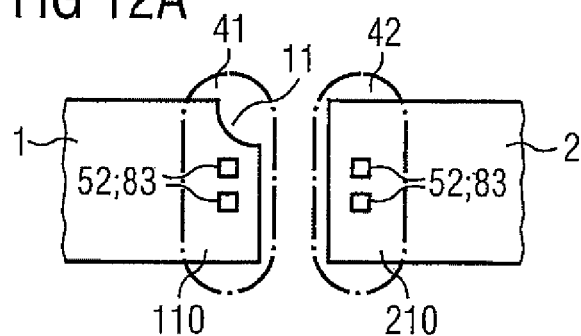
FIG. 12A shows a schematic plan view of two adjacent mounting panels in a mounting panel arrangement according to a tenth exemplary embodiment.
Figure 12B:
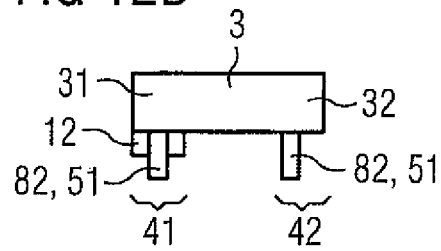
FIG. 12B shows a schematic side view of a connection body for connecting the mounting panels shown in FIG. 12A, FIGS. 13A and 13B show schematic plan views of the mutually facing sides of mounting panels and a connection body of a mounting panel arrangement, according to an eleventh exemplary embodiment.

FIGS. 12A and 12B show, schematically, a detail of a mounting panel arrangement according to a tenth exemplary embodiment. Two adjacent mounting panels 1, 2 are illustrated in the form of a schematic plan view in FIG. 12A. FIG. 12B shows a schematic side view of the connection body 3 which is intended to produce the plug connection between these mounting panels 1, 2.

In the tenth exemplary embodiment, the connection areas 110 and 120 do not differ in the position of the attachment elements 51, 52, which in the present case also represent electrical connecting points 83 and contact pins 82, in contrast to the previous exemplary embodiment. Instead of this, the first connection area 110 has a positioning element, in the present case a cutout 11, which the second connection area 210 does not have. The cutout 11 is, for example, milled out of the mounting panel 1. The connection body 3 has a projection 12 which engages in the cutout 11 when the mounting panel arrangement is assembled.

This once again ensures that the first attachment section 31 of the connection body 3 is suitable only for connection to the first connection area 110. For example, this protects the mounting panel arrangement against electrical polarity reversal during assembly.

Figure 13A:
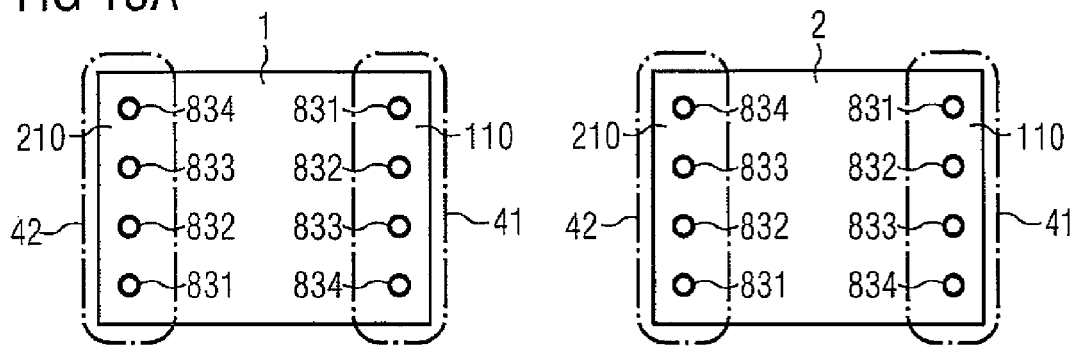
Figure 13B:
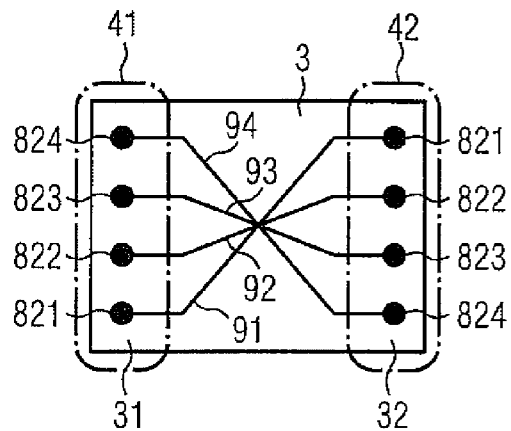

FIG. 13A shows two adjacent mounting panels 1, 2 of an eleventh exemplary embodiment of the mounting panel arrangement, in the form of a schematic plan view. FIG. 13B shows the connection body 3, which connects the mounting panels 1, 2 as shown in FIG. 13A in a mechanically stable manner once the mounting panel arrangement has been assembled, in the form of a plan view of its side facing the mounting panels 1, 2 after assembly.

In the eleventh exemplary embodiment, each of the once again identical mounting panels 1, 2 has a plurality of electrical connecting points 831, 832, 833, 834. First, second, third and fourth electrical connecting points are expediently electrically connected differently from one another. In other words, first, second and fourth electrical connecting points may have mutually different functions.

When viewing a plan view of the main plane of extent of the circuit board 1, 2, a first, a second, a third and a fourth electrical connecting point follow one another in the first connection area 110 when viewed in the clockwise direction. These are followed by a first, a second, a third and a fourth electrical connecting point following one another in the second connection area 210. This allows both the first connection area 110 and the second connection area 210 of the first mounting panel 1 to be connected to the second mounting panel 2. Irrespective of which of the two connection areas 110, 210 of the first mounting panel 1 is adjacent to the second mounting panel 2, the electrical connecting points 831, 832, 833, 834 are always arranged in the same sequence.

In the present mounting panel arrangement, the first and the second mounting panel 1, 2 are identical. A respective first electrical connecting point 831 on the first mounting panel 1 and a fourth electrical connecting point 834 on the second mounting panel 2, a second electrical connecting point 832 on the first mounting panel 1 and a third electrical connecting point 833 on the second mounting panel 2, a third electrical connecting point 833 on the first mounting panel 1 and a second electrical connecting point 832 on the second mounting panel 2, as well as a fourth electrical connecting point 834 on the first mounting panel 1 and a first electrical connecting point 831 on the second mounting panel 2 are therefore in each case directly opposite one another.

However, a first connecting point 831 on the first mounting panel 1 and a first electrical connecting point 831 on the second mounting panel 2, a second electrical connecting point 832 on the first mounting panel 1 and a second electrical connecting point 832 on the second mounting panel 2, a third electrical connecting point 833 on the first mounting panel 1 and a third electrical connecting point 833 on the second mounting panel 2, as well as a fourth electrical connecting point 834 on the first mounting panel 1 and a fourth electrical connecting point 834 on the second mounting panel 2 are in each case connected to one another by means of the connection body 3. For this purpose, the connection body 3 has four electrical connection equipments, whose connection lines 91, 92, 93, 94 cross (see FIG. 13B).

In this way, the electrical contact-making elements 821 of the first electrical connection equipment connect two first electrical connecting points 831, the electrical contact-making elements 822 of the second electrical connection equipment connect two second electrical connecting points 832, and so on. This is irrespective of any rotation of the first and/or of the second mounting panel 1, 2 and/or of the connection body 3 about an axis at right angles to the common main plane of extent. The electrical connections of the mounting panel arrangement are in this way protected against polarity reversal.

Figure 14:
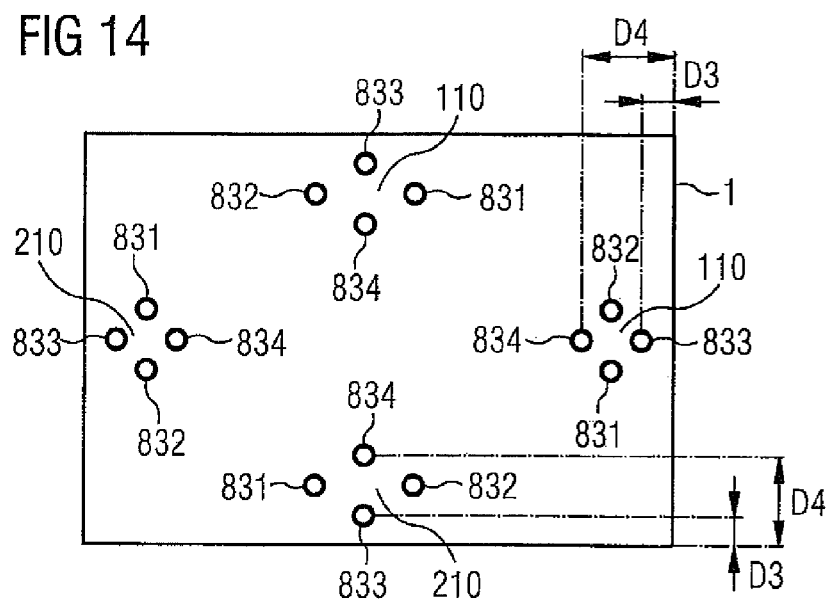
FIG. 14 shows a schematic plan view of a mounting panel according to a variant of the eleventh exemplary embodiment.

FIG. 14 shows a mounting panel 1 with an alternative arrangement of the electrical connecting points 831, 832, 833, 834. In this case, on each edge, the mounting panel 1 has a connection area 110, 210 with a plurality of electrical connecting points 831, 832, 833, 834. The first and second electrical connecting points 831 and 832 follow one another in the anticlockwise direction, as described above. The third and fourth electrical connecting points 833, 834 are, however, not arranged in a row parallel to the adjacent edge of the mounting panel 1 with the first and second electrical connecting points 831, 832. In fact, all the third electrical connecting points 833 are at a first distance D3 from the respectively adjacent edge, and all the fourth electrical connecting points 834 are at a second distance D4 from the respectively adjacent edge, with D4 being greater than the first distance D3.

The invention is not restricted by the description based on the exemplary embodiments. In particular, the invention can be used for any desired number of mounting panels. It covers every novel feature and every combination of features, in particular including any combination of features in the patent claims, even if this feature or this combination is not itself explicitly stated in the patent claims or exemplary embodiments.

We claim:

1. A mounting panel arrangement having a plurality of mounting panels for optoelectronic components, the mounting panel arrangement comprising: two adjacent mounting panels, of the plurality of mounting panels, coupled to one another by a connection body, wherein each of the two mounting panels has a connection area, each of which connection areas being associated with an attachment section of the connection body;
　　a plug connection, for each of the connection areas, formed between the connection area and the associated attachment section; and
　　a holding member adapted for stabilizing the plug connection between one of the connection areas and the associated attachment section,
　　wherein the holding member mechanically interacts with one of the mounting panels and the associated attachment section to stabilize the plug connection, such that at least a portion of the holding member is positioned in a hole which extends through the mounting panel in a direction perpendicular to a plane of the mounting panel.

2. The mounting panel arrangement according to claim 1 in which the plurality of mounting panels comprises pairs of adjacent mounting panels, wherein for each of the pairs of adjacent mounting panels,
　　the two adjacent mounting panels are connected to one another by means of a connection body,
　　each of the two adjacent mounting panels having a connection area each of which being associated with an attachment section of the connection body, and
　　for each of the connection areas, there is a plug connection formed between the connection areas and the associated attachment section.

3. The mounting panel arrangement according to claim 2, wherein the pairs of adjacent mounting panels are arranged in a row.

4. The mounting panel arrangement according to claim 1, comprising an LED module, which includes a first one of the two adjacent mounting panels and at least one radiation-emitting semiconductor component on the first mounting panel.

5. The mounting panel arrangement according to claim 4, comprising a further LED module having a second one of the two adjacent mounting panels and at least one radiation-emitting semiconductor component on the second mounting panel.

6. The mounting panel arrangement according to claim 1, wherein at least one of the connection areas and/or at least one of the attachment sections has at least one attachment element by means of which the plug connection is formed.

7. The mounting panel arrangement according to claim 6, wherein at least one of the connection areas includes a first attachment element, and the attachment section which is associated with the connection area includes a second attachment element.

8. The mounting panel arrangement according to claim 7, wherein the second attachment element forms a mating piece to the first attachment element.

9. The mounting panel arrangement according to claim 7, wherein the second attachment element engages in the mounting panel with which the attachment section is associated.

10. The mounting panel arrangement according to claim 7, wherein the first attachment element is a cutout and the second attachment element is a pin.

11. The mounting panel arrangement according to claim 6, wherein at least one of the attachment elements is in the form of a depression, a cutout, a projection, a pin or a ring.

12. The mounting panel arrangement according to claim 6, wherein at least one of the attachment elements includes a locking equipment.

13. The mounting panel arrangement according to claim 12, wherein at least a part of the surface of the attachment element is provided with sawtooth-shaped structures in order to form the locking equipment.

14. The mounting panel arrangement according to claim 1, wherein the holding member includes at least one further attachment element.

15. The mounting panel arrangement according to claim 1, wherein a front side of the first of the two adjacent mounting panels faces, at least in its connection area, the associated attachment section of the connection body.

16. The mounting panel arrangement according to claim 15, wherein a rear side of the second mounting panel faces, at least in its connection area, the associated attachment section of the connection body.

17. The mounting panel arrangement according to claim 1, wherein the attachment section and the holding member are arranged on mutually opposite sides of the connection area.

18. The mounting panel arrangement according to claim 1, wherein the holding member extends from the first connection area to the second connection area.

19. The mounting panel arrangement according to claim 18, having an additional plug connection which is formed between the connection body and the holding member in a central area between the first connection area and the second connection area.

20. The mounting panel arrangement according to claim 18, wherein the connection body and the holding member are similarly shaped.

21. The mounting panel arrangement according to claim 20, wherein each of the mutually separate pieces has an attachment element.

22. The mounting panel arrangement according to claim 1, wherein at least one of the attachment sections is structured into a plurality of mutually separate pieces.

23. The mounting panel arrangement according to claim 22, wherein the connection body includes a stabilization element, coupling the mutually separate pieces to one another in a mechanically stable manner in a central area between the attachment sections.

24. The mounting panel arrangement according to claim 1, wherein the main planes of extent of the mounting panels are parallel to one another.

25. The mounting panel arrangement according to claim 1, wherein a first of the attachment sections is adapted for forming the plug connection to a first of the connection areas, and the first attachment section is not adapted for forming a plug connection to the second connection area.

26. The mounting panel arrangement according to claim 1, wherein at least one of the mounting panels has a plurality of connection areas which are adapted for connection to at least one of the attachment sections of the connection body.

27. The mounting panel arrangement according to claim 26, wherein said at least one of the mounting panels is in the shape of a polygon in a plan view of its main plane of extent, and wherein said polygon has a plurality of rim areas which each comprise one of the edges of the polygon, and at least two of the rim areas each contain one of the connection areas.

28. The mounting panel arrangement according to claim 1, wherein the connection body includes an electrical connection equipment which has two contact-making elements which are electrically conductively connected to one another by means of an electrical connection line, wherein
 each of the connection areas includes an electrical connecting point,
 each of the attachment sections includes one of the two contact-making elements, and
 for each said connection area, the electrical connecting point of the connection area is electrically conductively connected to the contact-making element of the associated attachment section.

29. The mounting panel arrangement according to claim 28, wherein the connection body includes a plurality of electrical connection equipments.

30. The mounting panel arrangement according to claim 28, wherein at least one of the attachment elements constitutes one of the contact-making elements or one of the electrical connecting points.

31. The mounting panel arrangement according to claim 28, wherein at least one of the contact-making elements is a contact pin.

32. The mounting panel arrangement according to claim 28, wherein at least one of the electrical connecting points is a contact hole.

33. The mounting panel arrangement according to claim 28, wherein a first of the attachment sections is adapted for forming a plug connection to a first of the connection areas, and the first attachment section is not adapted for forming a plug connection to the second connection area, and the geometric arrangement of the contact-making elements and of the electrical connecting points in a first of the connection areas differs from the geometric arrangement of the contact-making elements and electrical connecting points in the second connection area.

34. The mounting panel arrangement according to claim 28 wherein at least one of the mounting panels has a plurality of connection areas which are adapted for connection to at least one of the attachment sections of the connection body, and wherein each of the connection areas includes a first electrical connecting point and a second electrical connecting point, with first and second electrical connecting points following one another alternately when viewed in the clockwise direction in a plan view of the main plane of extent of the mounting panel.

35. The mounting panel arrangement according to claim 28, wherein said at least one of the mounting panels is in the shape of a polygon in a plan view of its main plane of extent, and wherein said polygon has a plurality of rim areas which each comprise one of the edges of the polygon, and at least two of the rim areas each contain one of the connection areas, and each of the connection includes an electrical connecting point which is at a first distance from the edge of the rim area wherein the respective connection area is arranged, and has a further electrical connecting point, which is at a second distance from the edge of the rim area wherein the respective connection area is arranged, and the first distances are the same as one another, the second distances are the same as one another, but the first distances and second distances differ from one another.

36. The mounting panel arrangement according to claim 28, wherein the connection body includes a first and a second contact-making equipment, with each attachment section having a first contact-making element of the first contact-making equipment and a second contact-making element of the second contact-making equipment, and with first and second contact-making elements following one another alternately when viewed in the clockwise direction in a plan view of a plane which runs through all four contact-making elements.

37. The mounting panel arrangement according to claim 36, wherein the connection lines of the two contact-making equipments cross.

38. The mounting panel arrangement according to claim 28, wherein the connection body includes at least two contact-making equipments, with each attachment section having one contact-making element of one of the contact-making equipments, which is at a first distance from a side surface of that attachment section, the side surface facing away from the other attachment section, and has a further contact-making element of the other contact-making equipment, which is at a second distance from said side surface of that attachment section, and the first distances are the same as one another, the second distances are the same as one another, but the first distances differ from the second distances.

39. The mounting panel arrangement according to claim 1, wherein at least one of the mounting panels has at least one of the following elements: circuit board, printed circuit board, metal-core circuit board, flexible circuit board, ceramic mount.

40. The mounting panel arrangement according to claim 1, wherein the connection body includes a centerpiece which is deformable such that the two adjacent mounting panels can move with respect to one another.

41. The mounting panel arrangement according to claim 40, wherein the centerpiece is plastically deformable.

42. The mounting panel arrangement according to claim 40, wherein the centerpiece is U-shaped.

43. Mounting panel arrangement according to claim 40, wherein the centerpiece has at least one of the following elements: wire, cable, ribbon cable, flexible circuit board, metal link, flexible tube.

44. The mounting panel arrangement according to claim 1, wherein a centerpiece of the connection body is U-shaped.

45. A mounting panel arrangement for optoelectronic components, the mounting panel arrangement comprising:
two adjacent mounting panels coupled to one another by a connection body, wherein each of the two mounting panels has a connection region, each of which connection regions being associated with an attachment section of the connection body;
a plug connection, for each of the connection regions, formed between the connection region and the associated attachment section; and
a holding member adapted for stabilizing the plug connection between a first one of the connection regions and the associated attachment section,
wherein the attachment section and the holding member are arranged on mutually opposite sides of the first one of the connection regions.

46. The mounting panel arrangement of claim 45, wherein the attachment section and the holding member project from mutually opposite main faces of the mounting panel which has the first one of the connection regions.

47. The mounting panel arrangement of claim 45, wherein the attachment section and the holding member are inserted in a through-hole, from opposite sides, of the mounting panel which has the first one of the connection regions.

* * * * *